United States Patent
Khandekar et al.

(10) Patent No.: US 6,976,121 B2
(45) Date of Patent: *Dec. 13, 2005

(54) APPARATUS AND METHOD TO TRACK COMMAND SIGNAL OCCURRENCE FOR DRAM DATA TRANSFER

(75) Inventors: Narendra S. Khandekar, Folsom, CA (US); Michael W. Williams, Citrus Heights, CA (US); Howard S. David, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 419 days.

This patent is subject to a terminal disclaimer.

(21) Appl. No.: 10/058,838

(22) Filed: Jan. 28, 2002

(65) Prior Publication Data

US 2003/0145161 A1 Jul. 31, 2003

(51) Int. Cl.⁷ .............................................. G06F 13/16
(52) U.S. Cl. .......................... 711/105; 711/167; 710/58
(58) Field of Search ................................ 711/103, 104, 711/105, 167; 710/125, 24, 58, 74; 345/562

(56) References Cited

U.S. PATENT DOCUMENTS

| | | | | | |
|---|---|---|---|---|---|
| 5,666,521 | A | * | 9/1997 | Marisetty | 345/562 |
| 5,678,009 | A | * | 10/1997 | Bains et al. | 710/125 |
| 5,802,554 | A | * | 9/1998 | Caceres et al. | 711/103 |
| 5,926,828 | A | | 7/1999 | Khandekar | |
| 6,243,768 | B1 | | 6/2001 | Khandekar | |
| 6,473,828 | B1 | * | 10/2002 | Matsui | 711/104 |

* cited by examiner

*Primary Examiner*—B. James Peikari
(74) *Attorney, Agent, or Firm*—Blakely, Sokoloff, Taylor & Zafman LLP

(57) ABSTRACT

An apparatus and a method to track command signal occurrence for DRAM data transfer have been disclosed. In one embodiment, the apparatus includes an interface to couple to a data bus, the data bus to transfer data between the interface and one or more memory devices, and a logic unit to generate a command occurrence signal to identify when a command signal is issued, wherein a set of data transfer operations on one of the one or more memory devices are completed in response to the command occurrence signal, a transition of a flag signal, and a chip select signal corresponding to the one memory device. Other embodiments have been claimed and described.

26 Claims, 9 Drawing Sheets

APPARATUS AND METHOD TO TRACK COMMAND SIGNAL OCCURRENCE FOR DRAM DATA TRANSFER

BACKGROUND OF THE INVENTION

In the area of memories, dynamic random access memories (DRAMs) typically perform as the main memory of a computer system. That is, in a typical computer system, such as a desk top personal computer (PC), the main memory function is performed by DRAM devices. The operation of a DRAM generally entails the use of row and column addresses for addressing the memory, so that read and write operations may be performed on the DRAM components. It is appreciated that in many instances, DRAMs are utilized with a processor, such as a central processing unit of a computer, but in other instances, the DRAM may be used with other processing/controlling devices, such as memory controllers.

In order to provide much higher performance in faster computer systems, higher performance requirements are also placed on DRAMs to process data in much larger quantities and in much faster performance time. Thus, it is not uncommon to find DRAMs configured into banks of DRAM arrays, in which data transfer to and from the DRAM arrays are achieved by high data speed bursts. For example, a high-speed 256 mega bit (Mb) DRAM, arranged in multiple banks, may be clocked to provided data transfer with an issuance of a read and/or write access command. In one such configuration, it may be possible to provide a specialized clocked signal (referred to as a flag signal) to trigger the data transfer in response to the read or write access to the DRAM. In some instances, the data transfer may be effected with both the rising and falling transitions of the flag signal. For example, a first read/write access may be triggered on a rising transition of such a flag signal, while a second read/write access may be triggered in response to the falling transition of the flag signal. This data transfer to/from the DRAM at both the rising and falling transitions of the flag signal may allow two memory accesses in response to one cycle of the flag signal. For example, such a scheme may be implemented so that data transfer to/from one portion of the memory may be achieved in response to the rising transition of the flag signal and a second data transfer occurs to/from another portion of the memory in response to the falling transition of the clock signal.

However, in order to implement this scheme, a memory accessing protocol may require the use of four separate memory commands to perform the read and write accesses. For example, two commands (read on rising transition and read on falling transition) may be required to perform the read accesses at both transitions. Likewise, two write commands (write on rising transition and write on falling transition) may be required to perform write accesses at both transitions. Thus, four separate read/write commands may be required to ensure that the correct DRAM device transmits or receives the correct corresponding data. Although four separate read/write commands may be implemented in a DRAM accessing scheme, supporting four such different read and write commands may introduce complexity in the command structure. Having two additional commands may also detract from an ability to add other commands due to a limitation on the pin connections available on the DRAM device. An alternative is to have a DRAM controlling scheme in which only one read command and one write command control data transfers to/from the DRAM, but in which data transfers are effected at both rising and falling transitions of flag signal. By reducing the number of command encodings for read and write commands to two, it may be possible to simplify the memory controller command encodings and, further, reduce the pin count of DRAM devices (or, alternatively, to use the additional pins for other signals).

DETAILED DESCRIPTION OF THE INVENTION

Tracking of Flag Transitions

Figure 1:
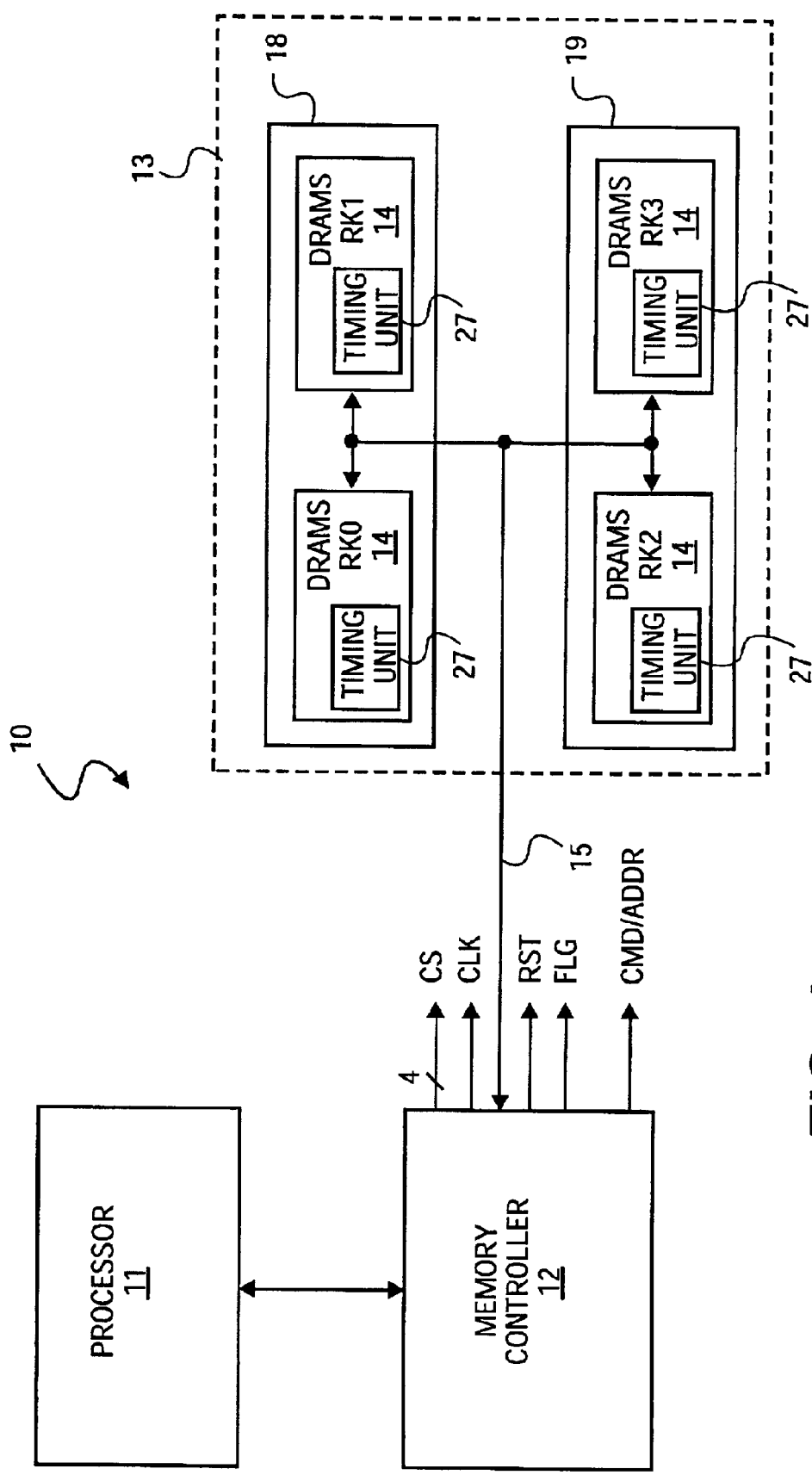
FIG. 1 is a block schematic diagram of a computer system utilizing a memory controller and a DRAM implementing an embodiment of the invention.

Referring to FIG. 1, an example computer system 10 is shown comprised of a processor 11, memory controller 12 and a memory 13, having a plurality of Dynamic Random-Access-Memory (DRAM) devices 14. In the example, the memory 13 has its DRAMs arranged in ranks (shown as RK0–RK3). The computer system 10 may be one of a variety of computer systems, including a Personal Computer (PC) system, in which case processor 11 may most likely be a central processing unit (CPU) of the PC. The processor 11 may also be comprised of a plurality of processors operating with one or more memory controllers 12. In the example computer system 10 of FIG. 1, the memory controller 12 provides controls to access the plurality of DRAMs 14 coupled to the memory controller 12. Typically the memory controller 12 provides the interface function between the processor 11 and memory 13 in order to transfer data to and from the DRAMs 14. In the embodiment of FIG. 1, memory controller 12 generates a variety of signals to memory 13 including the signals shown in FIG. 1.

The particular embodiment of the memory 13 has one or more DRAMs 14 configured into a grouping referred to as ranks. The example shows four ranks (RK0–RK3) of DRAM devices comprising the memory 13. It is appreciated that the number of such ranks may vary depending on the system configuration desired. The separation of the DRAMs 14 may be into other groupings defined differently than ranks. Furthermore, the DRAMs 14 may be categorized into various other types of groupings. For example, DRAMs may be configured to physical locations. In FIG. 1, RK0 is on one side of a Double Inline Memory Module (DIMM) 18, while RK1 is on the other side. Similarly, RK2 is on one side of another DIMM 19 and RK3 is on the other side of DIMM 19. Other arrangements may be readily utilized. In the description below a single DRAM is discussed, but the description is applicable to any number of DRAMs. Furthermore, the DRAMs 14 implement a timing unit 27, which is further described in reference to FIG. 2.

In the particular embodiment of computer system 10, those signals and lines pertinent to the understanding of the operation of the DRAMs 14 and memory controller 12 are noted. However, it is to be noted that not all of these signals may be needed to practice the invention. As shown, a data bus 15 coupled to the DRAMs 14 provide the data transfer coupling between the DRAMs 14 and the memory controller 12 or any other component coupled to the bus 15. In a read operation, data is read from the selected DRAM 14 onto the bus 15 and in a write operation data on the bus 15 is written to the selected DRAM 14. The signals shown include a clock signal (CLK), a command flag signal (FLG), the command and address signal (CMD/ADDR), and the chip select signals (CS).

As will be note below, the CLK signal provides the timing control to clock the DRAM devices 14. The FLG signal, coupled to the DRAMs 14, controls when data may be read from the DRAMs 14 or when data may be written into the DRAMs 14. The CMD/ADDR signal provides both command (CMD) and address (ADDR) information to the DRAMs 14. The CS signal selects a given rank of DRAM to be activated. Typically, a DRAM rank has its separate CS signal coupled from the memory controller 12. Thus, with four ranks of DRAMs shown, four separate CS signal couplings ensure that the correct DRAM device 14 activation may be achieved to select the appropriate DRAM 14 for reading or writing data from/to the memory 13. The memory controller 12 may also generate a reset signal (RST) to reset the DRAMs 14, however, some DRAMs may not utilize the reset feature.

As will be described also in reference to FIG. 2, the CMD/ADDR signal provides both command and address information to the DRAMs 14 of memory 13. It is appreciated that the command (CMD) and address (ADDR) information may be sent from the memory controller 12 to the DRAMs 14 in separate transmissions or the information may be multiplexed together in one transmission. The FLG signal operates in conjunction with the CMD signal and the CS signal to identify at which clock period the information may be either read from memory (if a read command is invoked) or written to memory (if a write command is invoked) to complete the data transfer initiated by the command signal. That is, the FLG signal transition initiates the trigger to effect or execute data transfer to/from the DRAM 14 after the command signal initiated the read or write process. As will be described below, the FLG, CS and CMD signals combine to generate a trigger (TRG) signal to transfer data to/from bus 15. The CS signal, coupled independently to the DRAMs, ensures that the correct rank (or other categorization of devices) may be selected for data transfer.

Figure 2:
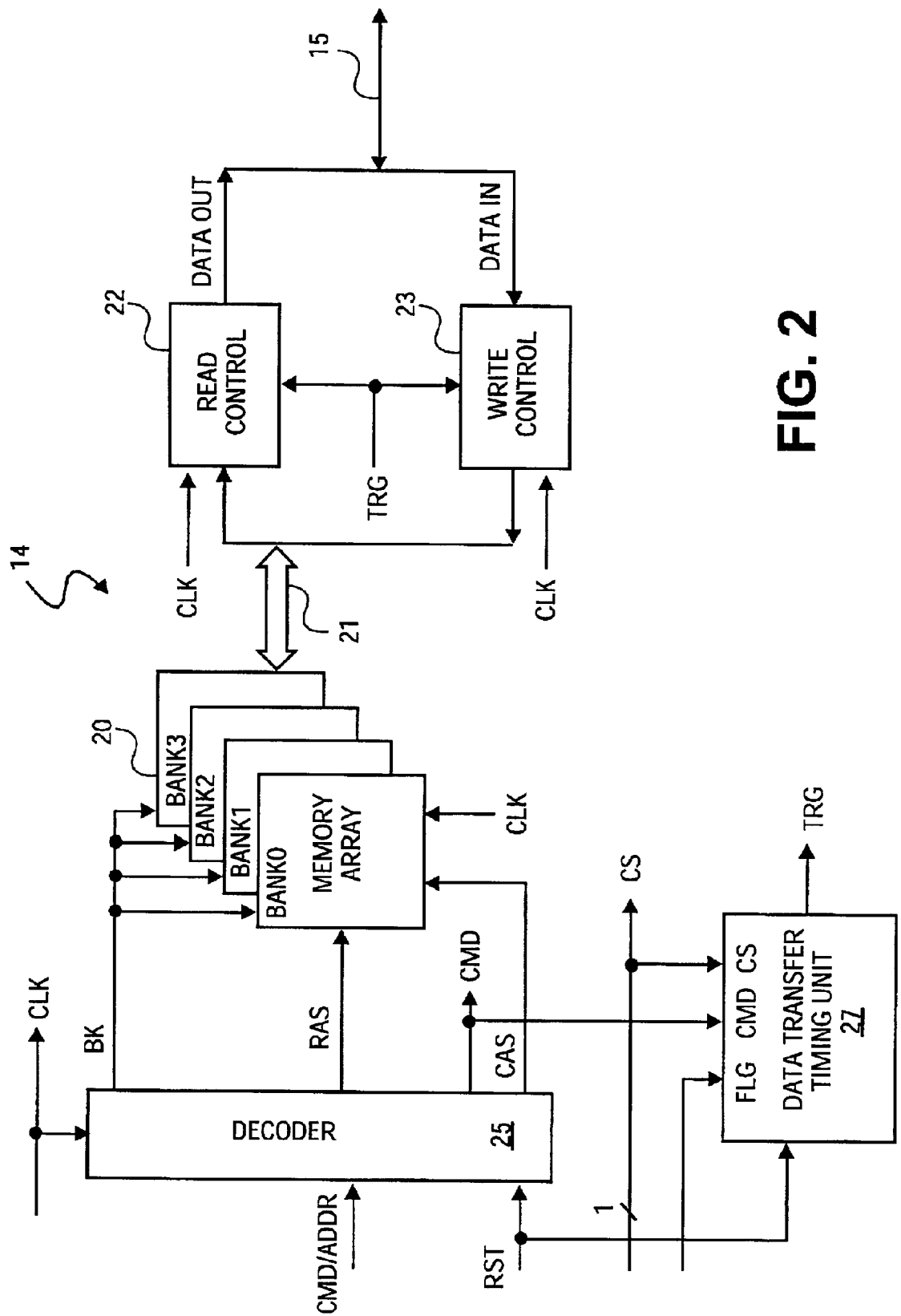
FIG. 2 is a block schematic diagram of a DRAM implementing a data transfer timing unit.

In FIG. 2, a more detailed illustration of one of the DRAM devices 14 is shown. That is, FIG. 2 illustrates one embodiment of a DRAM device that may be implemented in any one of the DRAM ranks shown in FIG. 1. In the particular embodiment shown, the DRAM device 14 comprises a plurality of memory arrays 20. In the particular example shown, four banks (BK0–BK3) of memory arrays 20 comprise the actual memory storage components for DRAM 14. It is appreciated that the actual number of such banks may vary on the design of the particular DRAM device.

An internal data bus 21 couples the memory arrays 20 to a read control unit 22 and a write control unit 23. The read control unit 22 controls the transfer of the data from the memory arrays 20 to the data bus 15, in response to the memory controller invoking the read command. Likewise, write control unit 23 controls the data transfer from the data bus 15 to the selected memory array 20 in response to the memory controller invoking the write command. The trigger signal TRG (also may be referred to as an internal flag signal intFLG) controls the timing for the data transfer onto/from the bus 15. It is to be noted that a variety of components typically comprise the circuitry implemented in the read control unit 22 and the write control unit 23. Generally these components include various latches, registers, buffers, drivers, and/or multiplexers. The actual circuitry implemented is not critical to the understanding of the present invention. What is to be understood is that data transfer between each DRAM unit 14 and the bus 15 may be effected by read and write control units (such as units 22 and 23), which control the timing (triggering) of the data transition between bus 15 and the DRAM units 14 by the timing provided by the TRG signal.

The CMD/ADDR signal is shown coupled to a decoder 25, which decodes the command signal and provides the command signal on the CMD line to the memory arrays 20. The decoder 25 decodes the address component ADDR into a row, column and bank address signals, correspondingly shown as RAS, CAS and BANK signals in the particular embodiment of FIG. 2. The RAS provides the addressing to select the particular row of the memory array 20. Likewise the CAS provides the addressing to select the particular column of the memory array 20. The BANK signal selects one of the banks of the memory array 20. Thus, with the combination of the RAS, CAS and BANK, a particular row and column of a particular bank may be selected for data transfer. It is appreciated that some DRAM units may not be separated into multiple banks. In some instances, a portion of one or more of the addressing signals may be coupled to the read control unit 22 (or even to the write control unit 23) to select a particular multiplexed data line for selecting the data to be transferred. Furthermore, other signals typically implemented with DRAMs may not be shown in FIG. 2, since such signals may not impact the understanding of the workings of the invention.

The command signal CMD determines if a read or a write operation will be performed to the selected address location. It is appreciated that the decoder 25 may be comprised of various other units including latches, registers, multiplexers and/or sequencers, which control the decoding and sequencing operations associated with the memory array 20.

Also as noted in FIG. 2, the reset signal RST is coupled to the decoder 25 and to a data transfer timing unit 27, which unit 27 generates the TRG signal. The CLK signal is coupled to the various units/components 20, 22, 23, 25 and 27 of DRAM 14. The TRG signal from the data transfer timing unit 27 is coupled to the read control unit 22 and the write control unit 23 to control when these units 22, 23 execute the data transfer to/from the bus 15. In the particular example, the FLG, CMD and CS signals determine the timing of the TRG transition. It is to be noted that the CLK signal may be processed internally within DRAM 14 to generate one or more internal CLK signal(s), which may have slightly timing differential from the received CLK signal.

Since the same CLK, FLG, and the CMD/ADDR signals are coupled to all of the DRAM units 14 of memory 13, the activation of a particular rank of DRAMs 14, or alternatively a particular memory device from a plurality of memory devices, may be controlled by the chip select signal CS. Thus, with individual CS signals coupled to the DRAMs 14, the selection of a particular rank of DRAM 14 may be achieved by providing an indication of the corresponding CS signal. Thus, in FIG. 2 for the particular DRAM device shown, the CS input to the memory array 20 activates the memory array 20 when the CS signal corresponding to that rank occurs. As will be noted below, the timing unit 27 uses this differentiation of the CS signal to control the TRG signal for groupings of DRAMs 14.

Figure 3:
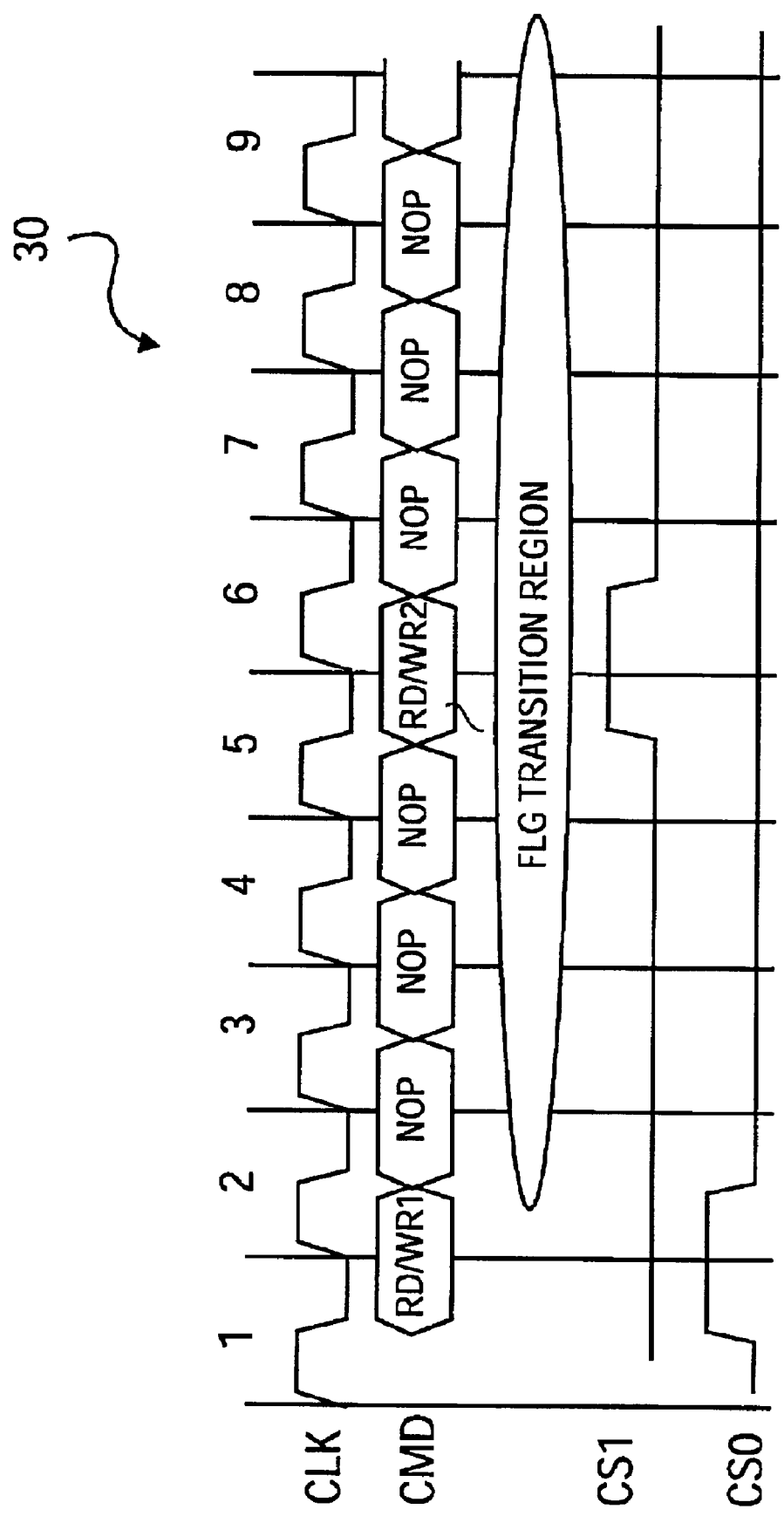
FIG. 3 is a timing diagram showing a region where flag transitions to effect data transfers may occur.

Referring to FIG. 3, a timing diagram 30 is illustrated showing one operative implementation of the invention. In the example embodiment shown, each CLK cycle is shown separated by a vertical line in which nine separate timing divisions are noted. Occurrences of read/write commands are also shown at every four timing intervals of the CLK signal. In the shown example, the first read or write command (RD/WR1) is associated with rank RK0, as noted by the high state shown for CS0 in the first and second clock period. The second RD/WR2 command signal occurs in the portions of clock periods 5 and 6. The second read or write command (RD/WR2) corresponds to the rank RK1, as noted by the activation of the CS1 signal in the same time period. The command signal RD/WR1 provides either a read or write command, while the activation of the CS0 signal signifies that the RK0 DRAM activates to either read the information from memory or write the information into memory. Likewise the RD/WR2 command signal dictates that a read or a write operation occurs with the DRAMs of RK1, since the CS1 signal is shown activated in this period. Again the RD/WR2 command signal causes a read or write operation to the RK1 DRAMs. CS3 and CS4 signals are not shown, but may be present.

Also as noted in FIG. 2, when a read operation occurs the data may be made available to the read control unit 22, but will not be output onto bus 15 until the TRG transition occurs. Likewise if the command is a write command, then the data transfer to the DRAM occurs with the TRG transition. As noted in FIG. 3, the FLG transition, whether rising transition or falling transition, may occur in one of the clocking periods after the occurrence of the corresponding read-write command. For example, the flag transition corresponding to RD/WR1 may occur in the FLG Transition Region of FIG. 3 following the issuing of the RD/WR1 command. If the DRAM protocol allows data transfer on either the rising or falling transitions of the FLG signal, miscues may occur if proper FLG timing is not maintained. For example, in the timing diagram of FIG. 3, if the FLG transition corresponding to the RD/WR1 command does not occur until the RD/WR2 command is invoked, then it is possible that incorrect data transfer may occur in respect to the RD/WR1 FLG transition. This type of miscue maybe occur in DRAMs transferring data on both the rising and falling transition edges.

As noted previously in the background section, one technique is to employ read and write commands which specify rising and falling edge transitions to avoid the miscue. However this may require the use of four separate commands for memory reads from and writes. The described embodiment implementing the data transfer timing unit (for example the unit 27 of FIG. 2) utilizes a tracking mechanism to ensure properly timed data transfer operation for the respective DRAM component. One implementation of achieving this timing is illustrated in the scheme of FIG. 4.

Figure 4:
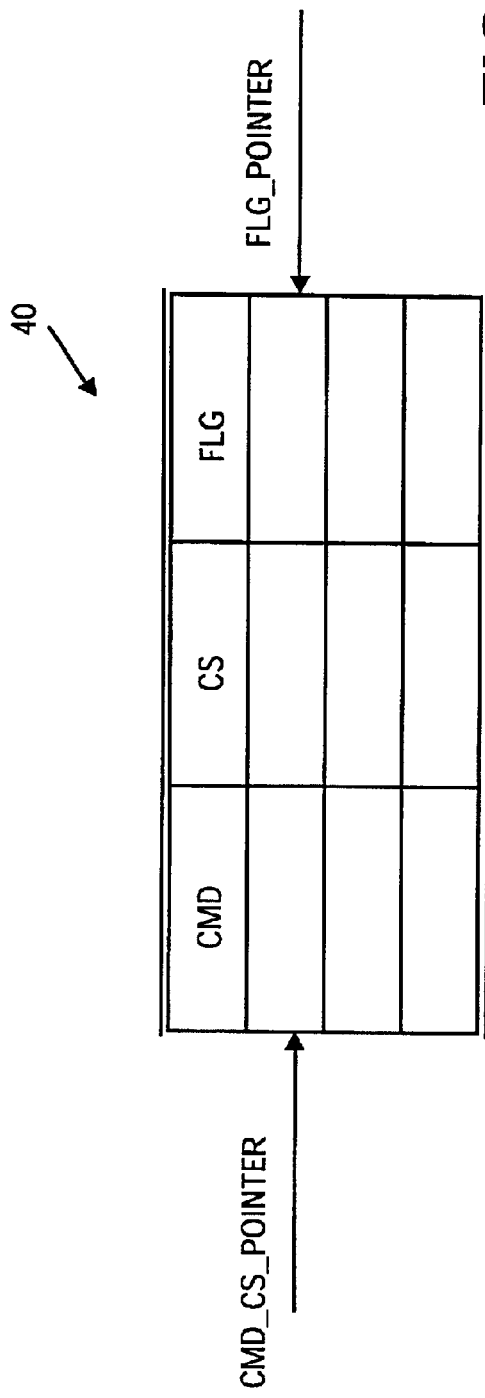
FIG. 4 is an entry table or queue to indicate occurrences of read/write commands, chip selects and flag transitions.

In FIG. 4, a table 40 is shown utilizing a three deep queue that tracks the CMD, CS, and FLG signals to ensure that proper data transfer occurs at the proper transitioning point of the FLG signal. The queue 40 may be managed by the use of two pointers shown as CMD_CS_POINTER and the FLG_POINTER. The queue 40 may be implemented in a circular fashion so that the pointers will return to the first entry after the third entry. In operation, both pointers point to the first entry when the DRAM is initialized. Typically this is achieved by a reset condition, such as when the memory controller 12 issues the RST signal (if the RST signal is utilized). The CMD entry is set (set is indicated in the example by value of "1") whenever the DRAM component detects a read (RD) or a write (WR) command. The CS entry is set to a "1" whenever the DRAM component detects the assertion of CS. This combination of CMD and CS entries being set indicates that the corresponding RD or WR (RD/WR) command is directed towards the particular DRAM selected. Thus, in FIG. 5, the CMD entry has a set value after the issuance of RD/WR. In the example of FIG. 1, for rank RN0, this occurs after the issuance of RD/WR1 and CS0

Figure 5:
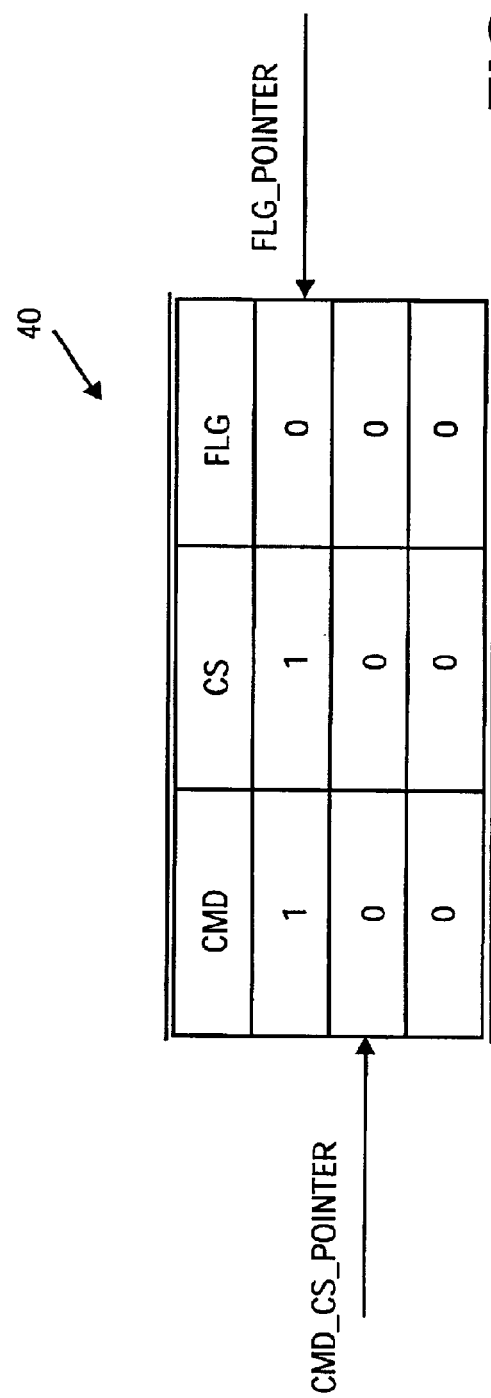
FIG. 5 shows the queue of FIG. 4 after the setting of command and chip select entries.

When viewed in reference to the timing of FIG. 3, the CMD entry has a set entry in clock period 2. The CMD_CS_POINTER advances to the next entry in the queue in the next clock, which is clock period 3 in the example of FIG. 3. The CS entry sets when the CS is asserted on the particular rank. Thus, the CS entry sets along with the CMD entry, if the CS is asserted on that DRAM. The example of FIG. 5 shows both the CMD and CS entries set, with the CMD_CS_Pointer advanced to the next entry.

Figure 6:
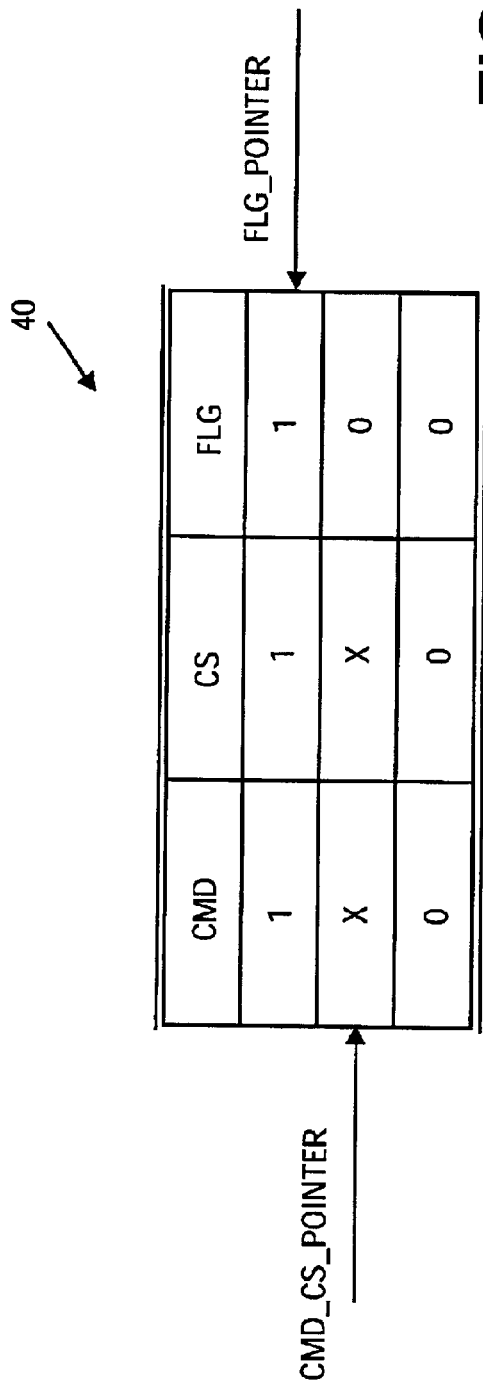
FIG. 6 shows the queue of FIG. 5 after the setting of the flag transition entry.
Figure 7:
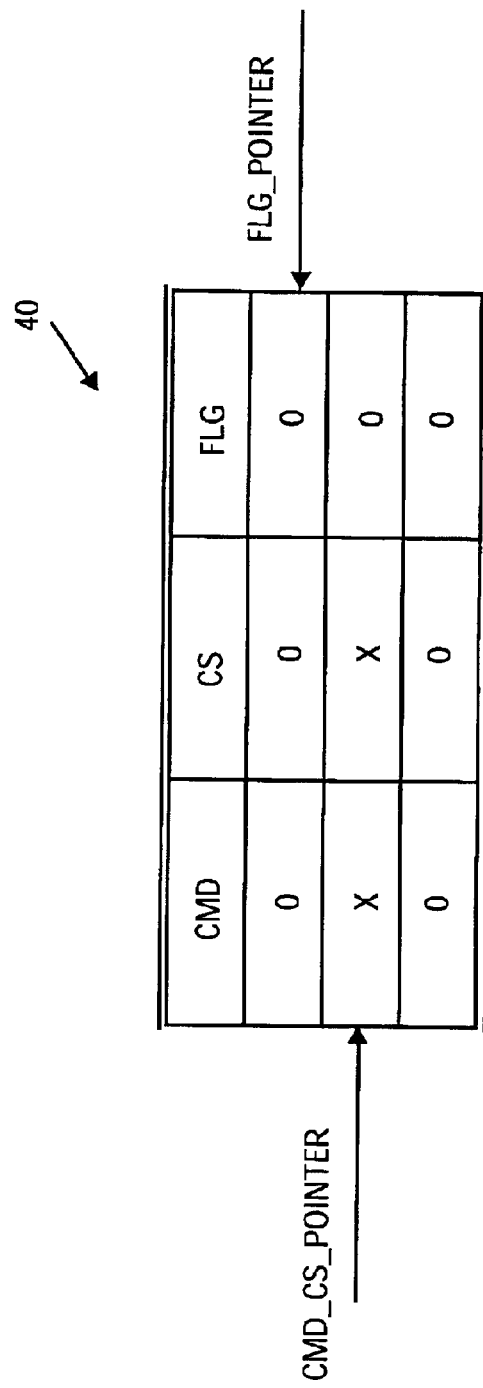
FIG. 7 shows the queue of FIG. 6 after clearing the first entries and moving a $FLG_{13}$ POINTER to the next row of entries.

The FLG entry sets to a "1" whenever the DRAM detects a transition on the FLG pin. It does not matter whether the transition is a rising or a falling one. This is shown in FIG. 6. When the FLG entry sets, all of the entries in the row may be cleared in the clock cycle after the one in which the FLG is set. Thus, for example, if the FLG transition occurs in clock period 6, the FLG entry will be set in the next clock period 7. The CMD, CS and FLG entries for the row entries in which the FLG sets may then be cleared in the next clock period, which is clock period 8, and the FLG_POINTER may increment in the subsequent clock period 9 to point to the next entry in the queue. This condition is illustrated in FIG. 7. The sequence may be repeated for the next entry.

In the particular example, it takes three clock transitions to set the FLG entry, clear the row of that entry and increment the FLG_POINTER. In other embodiments less or more clock periods may be used. Whatever the number of clock cycles are used, corresponding number of NOP (no operation) commands may be sent following a RD or WR command. In the example three NOPs are sent after the RD or WR command. As noted in FIG. 3, three NOPs are inserted between subsequent RD/WR commands. By ensuring that there are at least as many NOPs between RD/WR commands as it takes to set and clear the queue row and also to advance the FLG_POINTER, a given DRAM may be ensured to have the next row entry of the queue prepared to analyze the next flag transition. In this manner, if the next RD/WR command is to the same DRAM, the queue 40 will be prepared to handle the next FLG entry.

In many instances, the next RD/WR command may likely pertain to another DRAM device, so that the timing unit 27 for that DRAM handles the entries. In the above described embodiment, the timing unit 27 for each of the DRAMS tracks the entry inputs according to the above described protocol. Thus, the queue 40 for the DRAMs responds with FLG set, clear and FLG_POINTER advance with the FLG transitions.

The three entries of a given row of the queue identifies if the particular command is a RD or WR (by the CMD entry), if that DRAM is activated (by the CS entry) and if a FLG transition occurs to time the transfer of the data to/from the data bus (by the FLG entry). The setting of the CMD and CS entries indicate that a RD/WR command for that particular DRAM has issued and the setting of the FLG entry indicates when to perform the transfer. Accordingly, the timing unit 27 generates the TRG signal to effect the data transfer when all three entries of a row have "1" values. When ample NOPs are present between two adjacent RD/WR commands, the queue may be positioned (by the advancement of the two pointers) to handle the next set of signals. The queue (or table) 40 allows the tracking of the FLG signals and determines which transition is applicable to the read or write operation for the particular DRAM.

It is appreciated that a variety of schemes may be implemented to achieve the queue 40 arrangement. Since the queue 40 is a table with rotating entries, embodiments may be implemented in hardware, using latches and/or registers. The TRG signal indication may be noted when the three entries of a row are set, such as by performing a logical AND operation on the entry values. One embodiment implemented in hardware is described further below in reference to FIG. 11. A variety of other techniques may be readily implemented as well. Also, the timing unit 27 may be located in the DRAM device itself, or alternatively, timing unit 27 may be located in another integrated circuit which works in combination with the rank of DRAMs.

It is noted that the embodiment above utilizes in timings, in that commands are driven in the clock in which a CS signal is asserted. NOPs are driven on the command line in other clock periods. The memory controller 12 (shown in FIG. 1) implements this timing protocol to ensure that the DRAMs identify RD/WR command in the clock period the CS command issues. Ample NOPs may be used to ensure that the DRAM is cleared to receive the next RD/WR command. The FLG transitions generally have no impact on a given DRAM, unless both the CMD and CS command entries in the queue are set. Accordingly, DRAMS may not have false miscues on FLG transitions, since the data transfer does not occur with the FLG transitions alone. Rather, the TRG transition determines the timing for the data transfer to/from the data bus. Furthermore, the DRAMs of memory 13 may be configured to transition on either or both of the falling/rising transitions of the FLG signal when implementing the invention.

Tracking of Command Signal Occurrence with Chip Select

In some instances, if a number of DRAM components are present, the loading placed on the command lines and/or the distance from the controller to the DRAM device may cause timing differences on the command line. In those instances, the timing of the RD/WR command may not reach the appropriate DRAM component within an acceptable timing tolerance or the command may reach various DRAMs at different times. In order to ensure proper timing of the RD/WR commands, one approach is to have the controller generate a less time sensitive signal to indicate the occurrence of a RD/WR command.

Figure 8:
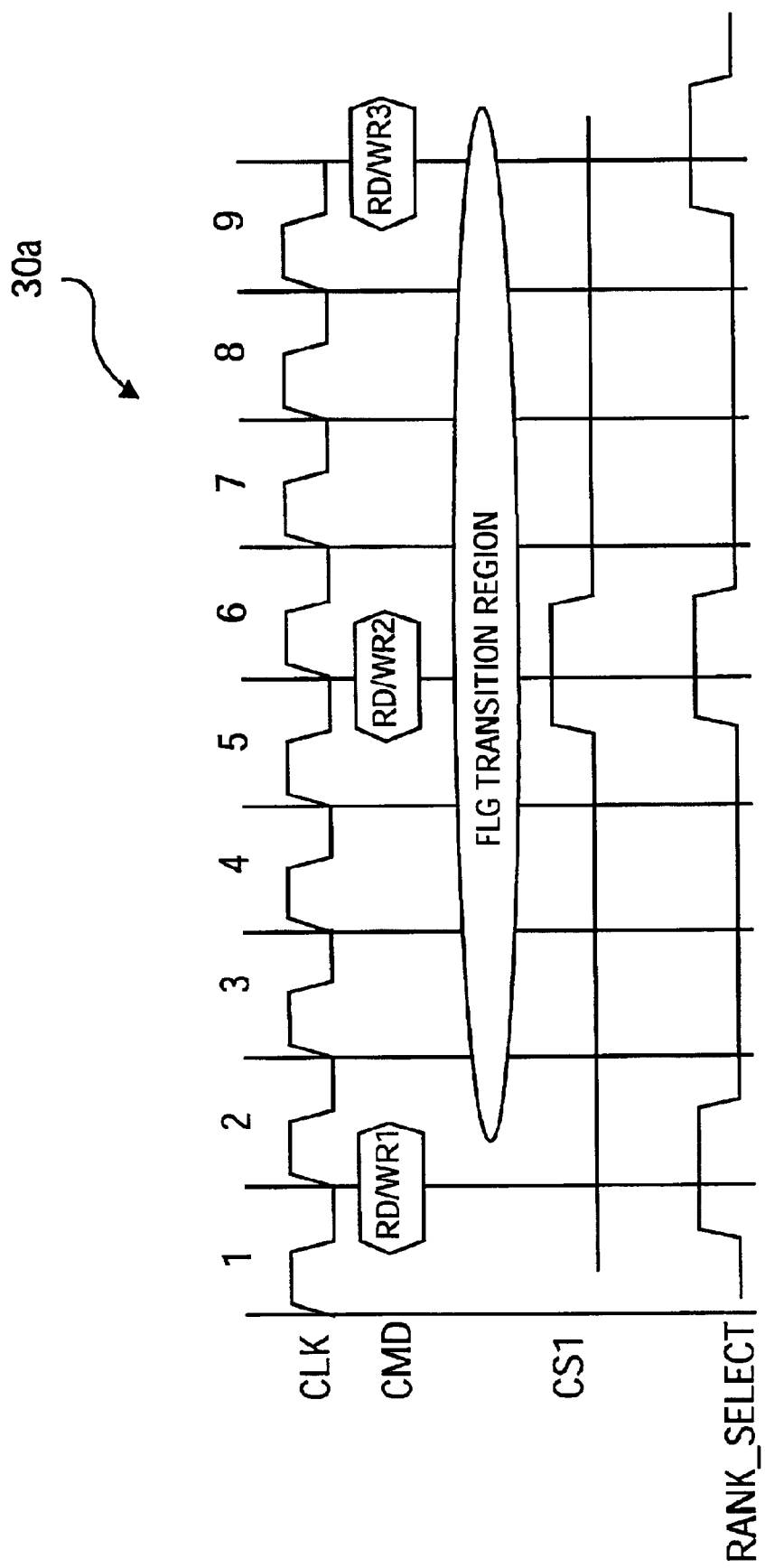
FIG. 8 is a timing diagram showing the use of a RANK-SELECT signal.

Accordingly, as shown in FIG. 8, one approach is to use a RANK_SELECT signal to identify when a RD/WR command generation occurs. Timing diagram 30a is similar to the diagram 30 of FIG. 3, but now with the inclusion of the RANK_SELECT signal. The RANK_SELECT signal may be a separate signal from the CMD signals but indicates that the RD/WR commands issue. Essentially, the rank-select signal is a command occurrence or indication signal, identifying the occurrence of the RD/WR command. In one embodiment, the RANK_SEL signal indicates a hit to main memory and does not include time critical components that go into CS generation.

Thus, the RANK_SELECT signal indicates that a RD or WR command issues and this indication is then qualified by monitoring the various CS assertion occurrence. Since the CS assertions occur in the period when RD or WR commands issue in memory device(s), an assertion of the RANK_SELECT indicates that a RD or WR command has issued to some DRAM device. In one embodiment, the RANK_SEL signal may be issued a clock earlier than the CS signal and this earlier assertion is guaranteed to have the signal reach the DRAM component, at least in the clock in which the CS# signal is asserted. Accordingly, with a separate signal, less time critical circuitry may be employed. Given the less timing critical nature of this signal, it can be used in configurations in which there is a heavy load on this signal.

Figure 9:
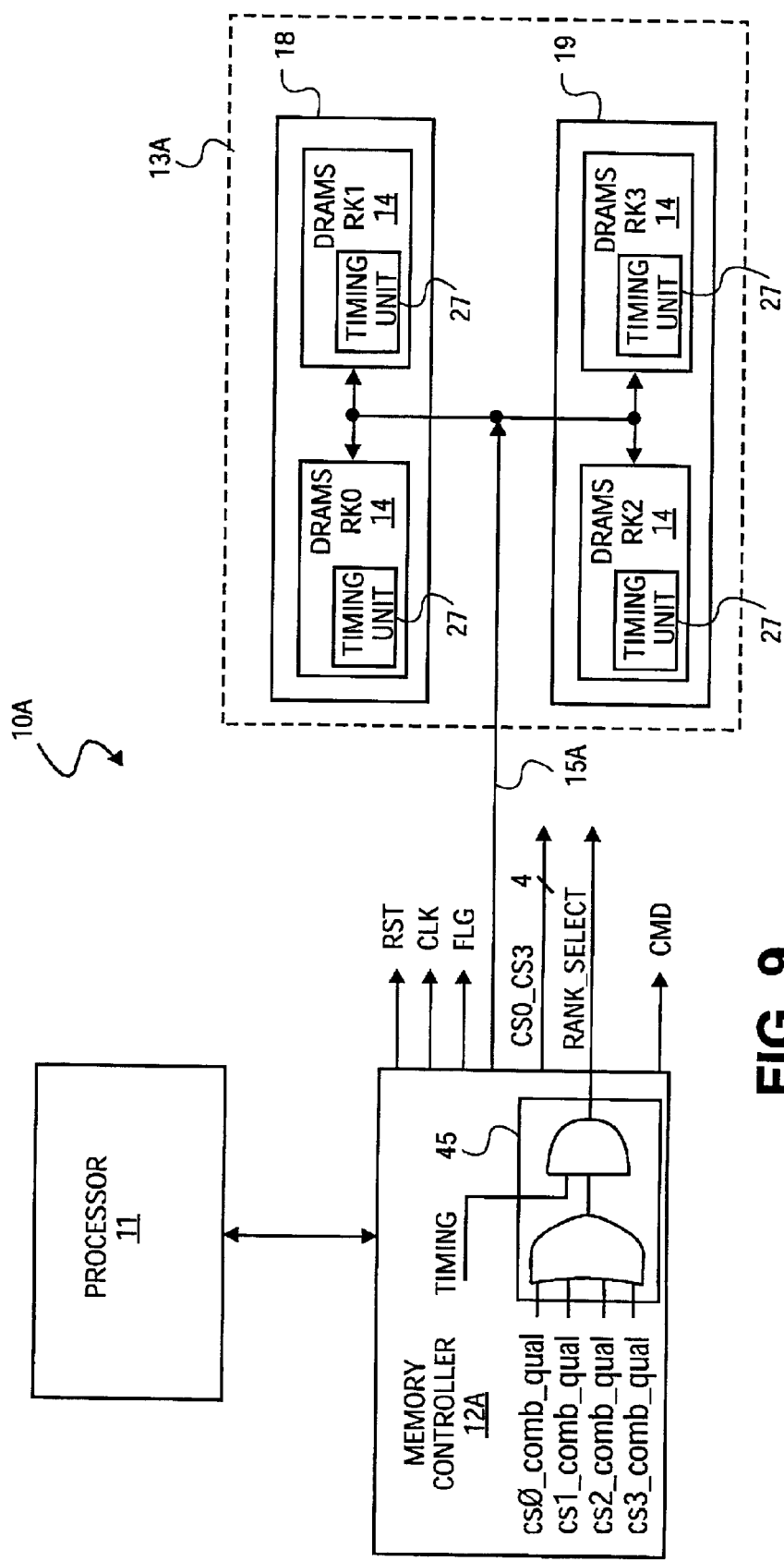
FIG. 9 is a block schematic diagram of a computer system utilizing a memory controller and a DRAM implementing an embodiment of the invention in which the RANK_SELECT signal of FIG. 8 is used.

One embodiment for generating the RANK_SELECT signal is shown in FIG. 9. A computer system 10A is equivalent to the computer system 10 of FIG. 1, except now the memory controller 12A includes a logic unit 45. The logic unit 45 generates the RANK_SELECT signal to a memory 13A so that data transfer on bus 15A may be controlled by the RANK_SELECT, CS and FLG entries instead of by CMD, CS and FLG entries. The command occurrence signal may be designed to indicate the occurrence of the RD/WR signal to one or more grouping of ranks of DRAMs or to all ranks.

Although a variety of circuits may be implemented, one embodiment is shown as circuit 45 in FIG. 9. The logic unit logically OR's the four CS_comb_qual signals and the OR'ed output is logically AND'ed with a TIMING signal, which times the actual assertion of the RANK_SELECT signal. The four CS_comb_qual signals (noted as CS0_comb_qual, CS1_comb_qual, CS2_comb_qual and CS3_comb_qual) designate combinational logic generated signals corresponding to their respective CS signals, but without the timing critical aspect required with the actual CS signals. The TIMING signal indicates the timing that the OR'ed output is actually asserted as the RANK_SELECT signal. The timing of the assertion may vary, but in one embodiment, the TIMING signal is asserted for two clock periods and the assertion commences one clock period before the assertion of CS. Thus, asserting the RANK_SELECT signal prior to the assertion of the CS signal avoids the miscue (which is possible with the CMD signal), that may occur with a heavily loaded circuit.

Figure 10:
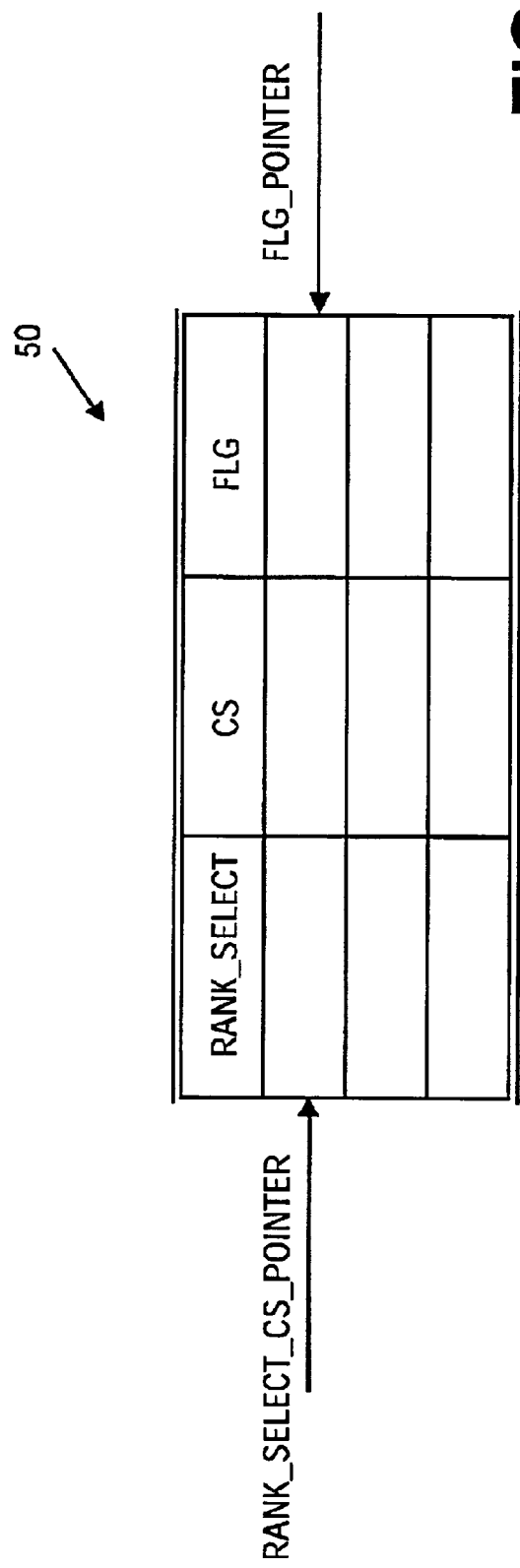
FIG. 10 is an entry table or queue of FIG. 4, but in which the RANK_SELECT entry is used instead of the CMD entry.

FIG. 10 shows a modified table or queue 50 which utilizes the RANK_SELECT signal for the first entry instead of the CMD entry for the corresponding queue 40 of FIG. 4. Thus, the RANK_SELECT, CS and FLG entries comprise the signal entries for the row. The RANK_SELECT entry will still set when a RD/WR command issues, but without the miscue.

It is to be noted that the logic to generate an indication signal, such as the described RANK_SELECT signal, may be of various implementations. This indication signal may be used to identify an issuance of a command, such as the RD/WR commands noted earlier, but avoid the miscue in heavily loaded circuits. This indication signal may be utilized in combination with the above described embodiment which uses the queue to generate the TRG signal for data transfer. When used in this scheme, the RANK_SELECT signal now replaces the CMD signal in the queuing table to indicate the occurrence of the command signal, but does not have the timing skew (miscue) of the CMD signal. In other embodiments, the RANK_SELECT signal may be utilized without the specific implementation of the queue 50. In such instances, the RANK_SELECT (or other defined) signal denotes the issuance of the RD, WR or other commands, so that actions in response to the generation of the command may be initiated. In the DRAM example above, the CS signal for a particular DRAM rank will determine which DRAMs will respond to the read or write command. In other embodiments, the RANK_SELECT signal may be sent to one rank, while the CS signal selects which DRAM device (s) will be selected. In some instances, the DRAM may respond to the issuance of the FLG signal for the data transfer. The data transfer may occur on one of the rising or falling transitions, or alternatively the transfer may occur on both transitions.

Furthermore, in the examples above, the timing of the commands noted three NOP commands to ensure the clearing of the queue entries. In some instances when the queue may not be used to the extent, one NOP following the RD/WR command may be sufficient to ensure proper timing of the data transitions when the RANK_SELECT signal is implemented. The actual timing will depend on the designed system and the requirements placed on the devices comprising the memory.

Exemplary Circuit Implementation of the Tracking Table

Figure 11:
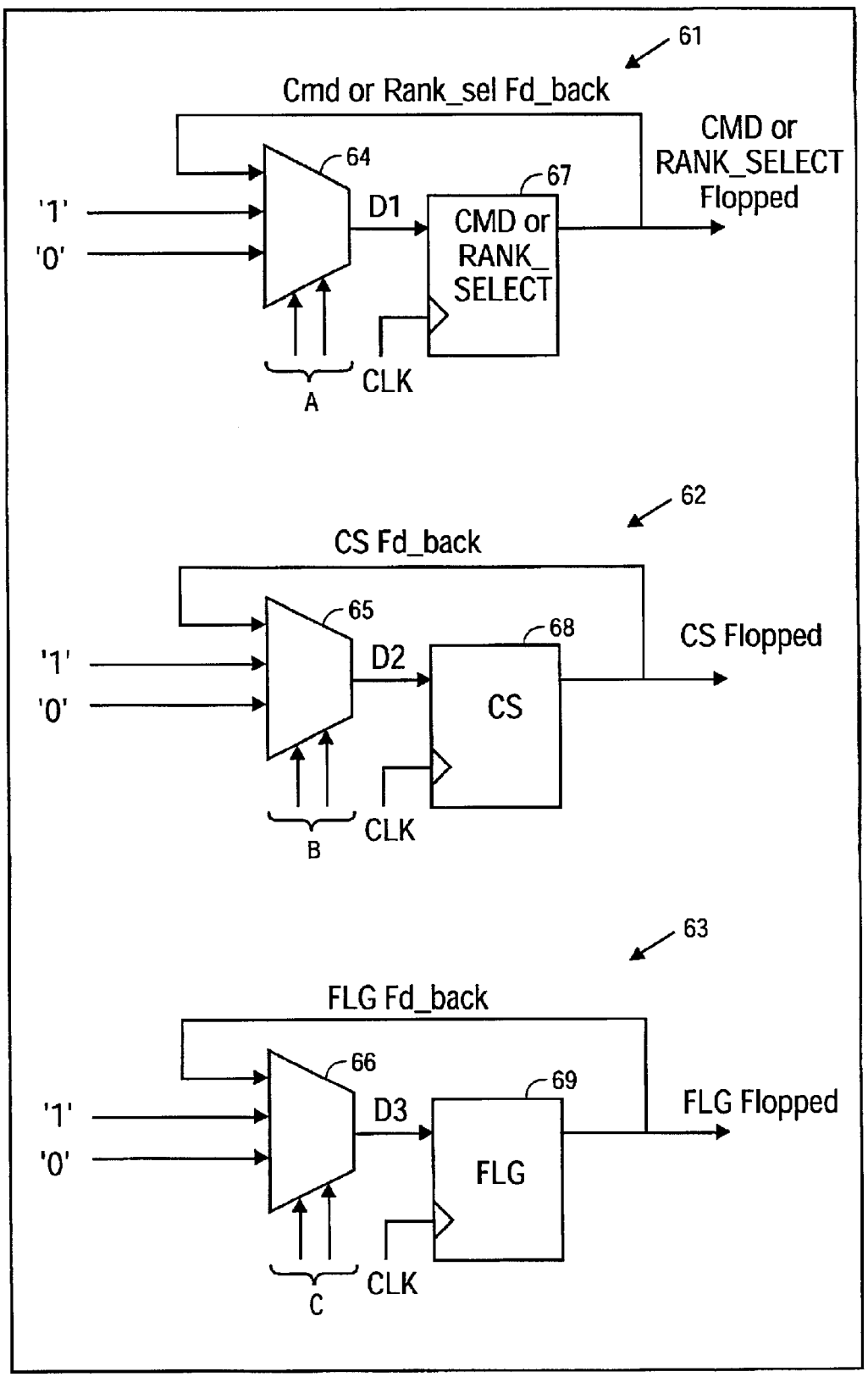
FIG. 11 shows one example embodiment to implement the queues of FIGS. 4 and 10.

One embodiment to implement the queue 40 or 50 in circuit form is exemplified in FIG. 11. A circuit 60 comprises three circuit stages 61–63. The three circuit stages 61–63 operate equivalently as a single entry table, where the entries correspond to the values associated with entries pointed to by the pointers of queues 40, 50. A flopped output of the stage 61 corresponds to the CMD or the RANK_SELECT entry, depending on which queue 40 or 50 is being used. A flopped output of the stage 62 corresponds to the CS entry and flopped output of the stage 63 corresponds to the FLG entry. The stages 61–63 comprise respective multiplexers 64–66 and respective latches (such as D flip-flops) 67–69. The multiplexers 64–66 have "0" and "1" inputs, as well as flopped signals fed back from the respective stage outputs. The multiplexer outputs (shown as D1–D3 respectively) couple as inputs to the respective latches 67–69.

For the multiplexer 64 of stage 61, the select control is noted as A and the logic for determining the output D1 of the multiplexer 64 by select control signal A may be implemented as follows:

D1='1' if CMD(or RANK_SELECT)='1'
D1='0' if CMD(or RANK_SELECT)Flopped='1' and FLG Flopped='1' and CS Flopped='1'
otherwise, D1=CMD(or RANK_SELECT)Fd_Back Note that the flopped back signal (Fd-Back) is the Flopped output fed back to the input of the multiplexer.

For the multiplexer 65 of stage 62, the select control is noted as B and the logic for determining the output D2 of the multiplexer 65 by select control signal B may be implemented as follows:

D2='1' if CS='1'
D2='0' if CMD(or RANK_SELECT)Flopped='1' and FLG Flopped='1' and CS Flopped='1'
otherwise, D2=CS Fd_Back For the multiplexer 66 of stage 63, the select control is noted as C and the logic for determining the output D3 of the multiplexer 66 by select control signal C may be implemented as follows:

D3='1' if FLG='1'
D3='0' if CMD(or RANK_SELECT)Flopped='1' and FLG Flopped='1' and CS Flopped='1'
otherwise, D3=FLG Fd_Back Accordingly, the logic A–C determine when there is a respective flopped output, which is delayed one clock period from the input, when an input indication is noted. That is, a respective flopped output is indicated when CMD (or RANK_SELECT), CS and/or FLG transitions are noted. When all flopped outputs indicate a "1" condition, data transfer may be triggered, followed by a reset of the flopped outputs one clock cycle later. In other conditions, the entries remain unchanged. It is appreciated that a variety of logic circuits may be implemented to provide the logic controls A–C. Similarly, the flopped outputs may be combined in a variety of ways to provide the TRG signal. One example being a logical AND function of the flopped outputs.

Accordingly, one hardware implementation is illustrated to implement the queues or tables described above to practice the invention. Furthermore, in reference to the examples provided, although a DRAM is described, a variety of other memory devices may implement the invention. Similarly, although a memory controller is described, other controllers, processors (including central processing units) may include embodiments to practice the invention.

Thus, a scheme to track DRAM data transfer is described. It is to be noted that although a DRAM is described above, other devices (including other memory devices) may implement the invention. The invention need not be limited to a DRAM application only. Furthermore, although a particular grouping of DRAMS is described with the rank arrangement, the invention may be practiced with other arrangements as well.

We claim:

1. An apparatus comprising:
   an interface to couple to a data bus, the data bus to transfer data between the interface and one or more memory devices;
   a logic unit to generate a command occurrence signal to identify when a command signal is issued, wherein a plurality of data transfer operations on one of the one or more memory devices are completed in response to the command occurrence signal, a transition of a flat signal, and a chip select signal corresponding to the one memory device.

2. The apparatus of claim 1, wherein the command occurrence signal, chip select signal and the flag signal are captured by a table entry in the one memory device, so that an indication of a presence of all three signals causes a trigger signal to be generated in the one memory device to complete the plurality of data transfer operations.

3. The apparatus of claim 2, wherein the table entry is to be cleared after the one memory device receiving the flag signal to allow said table entry to receive a next set of command occurrence, chip select, and flag signals to determine if the trigger signal is to be generated for the one memory device with the next set of command occurrence, chip select and flag signals.

4. The apparatus of claim 3, wherein the transition of the flag is a positive transition or a negative transition.

5. The apparatus of claim 3, wherein the one or more memory devices include one or more dynamic random access memories (DRAM).

6. The apparatus of claim 1, wherein the command signal is a read or write command signal for the one memory device.

7. An apparatus comprising:

a memory, coupled to a data bus, to transfer data between said memory and the data bus in response to a command signal to initiate a plurality of data transfer operations, said memory to operate as one of a plurality of memories in which a chip select signal selects said memory from the plurality of memories, wherein the plurality of data transfer operations are initiated in response to a command occurrence signal; and a timing unit, coupled to the memory, to receive the command occurrence signal, a flag signal, and the chip select signal, said timing unit to generate a trigger signal in response to the flag signal to complete the plurality of data transfer operations if the command occurrence signal and the chip select signal indicate that said memory is selected.

8. The apparatus of claim 7 wherein the command signal is a read command or write command.

9. The apparatus of claim 8 wherein the command occurrence signal is a rank select signal to select a rank of memory containing the memory to be selected by the chip select signal.

10. The apparatus of claim 9, wherein said timing unit includes table entries to maintain a record of the rank select signal, the chip select signal, and the flag signal, so that a rank entry is to be set when the rank select command is present, a chip select entry is to be set when the chip select signal is present, and the flag entry is to be set when the flag signal is present, the trigger signal is to be generated to complete the plurality of data transfer operations when all three respective entries are set.

11. The apparatus of claim 10, wherein the respective table entries are to be cleared after the memory receiving the flag signal to allow the entries to receive a next set of rank select, chip select, and flag signals.

12. The apparatus of claim 11, wherein the transition of the flag signal is a positive transition or a negative transition.

13. The apparatus of claim 12, wherein said memory is a dynamic random access memory (DRAM).

14. The apparatus of claim 9, wherein said timing unit includes a table having entries arranged in a queue to maintain a record of occurrences of the rank select, chip select, and flag signals, so that subsequent occurrences of all three signals is to be recorded.

15. The apparatus of claim 14 further includes a first pointer to point to a next set of entries after recording the occurrence of the rank select and chip select signals; and a second pointer to point to the next set of entries after recording the occurrence of the flag signal.

16. The apparatus of claim 14, wherein said memory is a dynamic random access memory (DRAM).

17. A system comprising:

a controller to generate a command signal, a chip select signal, a rank select signal, and a flag signal associated with the command signal;

a bus coupled to said controller; and a plurality of memories coupled to the controller via the bus, said bus to transfer data between one of the plurality of memories and the bus in response to the command signal, the one of said plurality of memories being selected by the chip select signal for a data transfer, wherein the rank select signal is asserted prior to the chip select signal to allow the flag signal to complete the data transfer.

18. The system of claim 17, wherein one of the plurality of memories includes a timing unit having a table of entries to maintain a record of the rank select signal, the chip select signal, and the flag signal, so that a rank select entry is to be set when the command signal is a read or write command, a chip select entry is to be set when the chip select signal is present, and the flag entry is to be set when the flag signal is present, and a trigger signal is to be generated to complete the data transfer when all three respective entries are set.

19. The system of claim 18, wherein the respective entries are to be cleared after the one of the plurality of memories receiving the flag signal to allow the entries to receive a next set of rank select, chip select, and flag signals.

20. The system of claim 19, wherein the transition of the flag signal is a positive transition or a negative transition.

21. The system of claim 19, wherein the plurality of memories include one or more dynamic random access memories (DRAM).

22. A method comprising:

issuing a command signal to perform a read or write operation;

issuing a chip select signal to select a memory device from a plurality of memory devices to perform a data transfer for the read or write operation;

issuing a command occurrence signal to identify when the command signal is issued, the command occurrence signal being issued prior to the chip select signal;

generating a flag signal in response to the issuing of the command signal; and capturing occurrences of the command occurrence signal, chip select signal and the flag signal in the memory device; and generating a trigger signal when the command occurrence, chip select, and flag signals present are captured in the memory device, the trigger signal to complete the data transfer for the read or write operation in the memory device.

23. The method of claim 22 wherein the command occurrence signal is asserted one clock period prior to the chip select signal being asserted.

24. The method of claim 23, wherein said capturing the signals comprises setting entries on occurrences of the signals.

25. The method of claim 24 further including the clearing of the entries after occurrence of the flag signal.

26. The method of claim 23, wherein the plurality of memory devices include one or more dynamic random access memories (DRAM).

* * * * *